(12) United States Patent
Spann (10) Patent No.: US 11,798,868 B2
(45) Date of Patent: Oct. 24, 2023

(54) METAL TAB FOR CHIP ASSEMBLY

(71) Applicant: Littelfuse, Inc., Chicago, IL (US)

(72) Inventor: Thomas Spann, Furth (DE)

(73) Assignee: Littelfuse, Inc.

(*) Notice: Subject to any disclaimer, the term of this patent is extended or adjusted under 35 U.S.C. 154(b) by 366 days.

(21) Appl. No.: 17/182,582

(22) Filed: Feb. 23, 2021

(65) Prior Publication Data

US 2021/0272884 A1 Sep. 2, 2021

(30) Foreign Application Priority Data

Feb. 27, 2020 (EP) .................................. 20159815

(51) Int. Cl.
*H01L 23/495* (2006.01)
*H01L 23/15* (2006.01)

(52) U.S. Cl.
CPC ........ *H01L 23/49541* (2013.01); *H01L 23/15* (2013.01); *H01L 23/49568* (2013.01); *H01L 23/49582* (2013.01)

(58) Field of Classification Search
CPC ............... H01L 23/49541; H01L 23/15; H01L 23/49568; H01L 23/49582; H01L 23/495; H01L 23/3735; H01L 23/49562; H01L 24/48; H01L 24/37; H01L 23/49517; H01L 24/06; H01L 24/49; H01L 24/40; H01L 2224/37147; H01L 2224/40227; H01L 2224/48491; H01L 2924/181; H01L 2224/48247; H01L 2224/49111; H01L 2224/0603; H01L 2224/32225; H01L 2924/10253; H01L 2224/73221; H01L 2924/00014; H01L 2924/00012; H01L 2224/45099; H01L 2924/37099

USPC .......................................................... 257/676
See application file for complete search history.

(56) References Cited

U.S. PATENT DOCUMENTS

| | | | |
|---|---|---|---|
| 6,147,410 A | 11/2000 | Elliott et al. | |
| 9,406,592 B2* | 8/2016 | Kohl | H01L 23/49838 |
| 10,412,840 B1* | 9/2019 | Marggraff | H05K 1/115 |
| 11,538,734 B2* | 12/2022 | Mohn | H01L 24/48 |
| 2012/0235288 A1* | 9/2012 | Shinkai | H01L 23/49558 257/676 |
| 2015/0357303 A1 | 12/2015 | Kohl et al. | |

FOREIGN PATENT DOCUMENTS

| | | | | |
|---|---|---|---|---|
| CN | 209312751 U | * | 8/2019 | ............. H01L 23/40 |
| JP | H02-281737 A | | 11/1990 | |
| WO | 0007238 | * | 2/2000 | |
| WO | 0007238 A1 | * | 2/2000 | ............. H01L 24/26 |

* cited by examiner

*Primary Examiner* — Wasiul Haider
(74) *Attorney, Agent, or Firm* — KDW Firm PLLC (57) ABSTRACT

A semiconductor die having a metal tab connected thereto. The metal tab includes at least one slot on at least one side of the metal tab, wherein the at least one slot i) creates an opening between at least two portions of the metal tab and ii) exposes the semiconductor die in relation to the metal tab. The semiconductor die can be a silicon (Si) die and the metal tab can be a copper (Cu) tab, where the at least one slot includes at least four slots corresponding to each of at least four sides of the metal, and wherein with respect to each of the at least four sides, each corresponding slot i) creates an opening between at least two portions of the Cu metal tab and ii) exposes the Si semiconductor die in relation to the Cu metal tab.

20 Claims, 5 Drawing Sheets

METAL TAB FOR CHIP ASSEMBLY

CROSS REFERENCE TO RELATED APPLICATION

This application claims the benefit of priority to, European Patent Application No. 20159815.8, filed Feb. 27, 2020 entitled "Metal Tab for Chip Assembly," which application is incorporated herein by reference in its entirety.

BACKGROUND

Field

Embodiments relate to the field of semiconductor devices, and in particular, packages for powering semiconductor chips.

Discussion of Related Art

Present day power semiconductor modules, including insulated gate bipolar transistors (IGBT) or diode and thyristor power modules (e.g. 1.2, 1.7, 3.3 kV, 4.5 kV or 6.5 kV; eg 1500 A or 1200 A) may include multiple substrates, such as 2, 4 or 6 substrates, similar to each other.

One aspect of packaging associated with the semiconductor modules can include contacting chips in association therewith with wires, ribbons, clips or tabs, which can be wire bonded, sintered, or soldered to a die top side of the semiconductor module. In embodiments employing metal tabs, the tabs can include one or more materials or layers of materials and can be used to facilitate a connection to the die top side (or another portion of the die), but using alloys that include copper (Cu), iron (Fe) or iron alloys, molybdenum (Mo), and/or other metals pose certain economic and mechanical deficiencies in the overall packaging scheme.

In view of the above, the present embodiments are provided.

BRIEF SUMMARY

In some embodiments, a semiconductor device is provided. The device includes: a metal tab, and a semiconductor die connected to the metal tab, where the metal tab includes at least one slot on at least one side of the metal tab, where the at least one slot i) creates an opening between at least two portions of the metal tab and ii) exposes the semiconductor die in relation to the metal tab.

In another embodiment, a method for forming a semiconductor device is provided. The method includes: dividing a metal tab into at least four pieces, where each piece is associated with a slot separating at least two portions of the metal tab, and connecting the metal tab to a semiconductor die to form a semiconductor device.

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device package and techniques for assembly are provided for power semiconductor devices.

Metal tabs associated with semiconductor packaging, e.g. tabs connected to a top side (or other side) of a semiconductor die, e.g. a silicon (Si) die, can be a pure metal, such as molybdenum (Mo) or can be a composed sandwich of metals of two or more metals, such as copper (Cu), iron (Fe) or iron alloy, molybdenum (Mo), and/or any other suitable metal. Using metal tabs increases the costs associated with the manufacturing, and presents other performance defects when utilizing the device, including conductivity and mechanical deficiencies. However, utilizing tabs of primarily one type of metal or solely of one type of metal, such as copper (Cu), although cheaper with respect to the manufacturing process and although more effective with respect to certain performance properties, such as conduction, presents a challenge when thermomechanical stress associated with use of the device is applied. In those instances, e.g. where a pure metal tab is used, the rate of expansion or shrinkage of the metal tab can exceed the rate of expansion or shrinkage of the die, which can cause more severe adverse device operation. Accordingly, various aspects of the present disclosure address this and other problems by improving the functionality of any type of metal tab in relation to a semiconductor die by dividing the tab into one or more portions to reduce the adverse effects associated with its operation, where, in several embodiments, this feature can make using metal tabs of one type of metal, e.g. Cu, more effective and feasible.

Figure 1A:
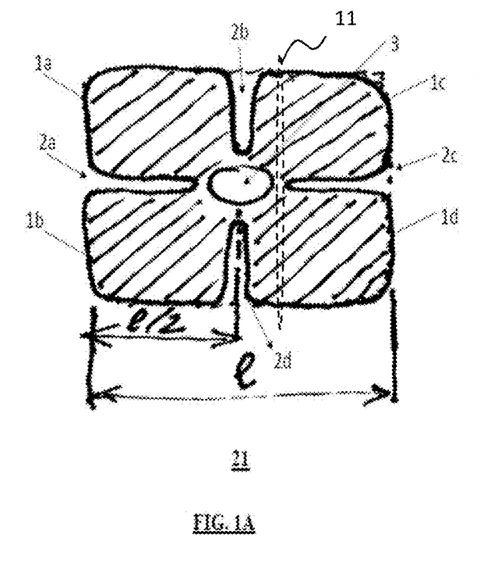
FIG. 1A shows a metal tab for use in semiconductor packaging in accordance with at least one embodiment of the present disclosure.

Turning to FIG. 1A there is shown a metal tab 21 according to various embodiments of the disclosure. The metal tab 21 can be a pure metal or a metal alloy or a sandwich of pure metals or metal alloys, e.g. any combination of Mo, Fe, Cu, and/or any other suitable metal. In various embodiments the metal tab 21 can be a tab of solely one type of metal, such as Cu. As shown, the metal tab can be divided into one or more portions 1a, 1b, 1c, and 1d associated with one or more openings, slot or slots (hereinafter "slots") 2a, 2b, 2c, and 2d, etc. In various embodiments, a slot, e.g. 2a, 2b, 2c, and 2d is in between at least two portions of the metal tab 21, e.g. 1a, 1b, 1c, and 1d respectively. In various embodiments, the metal tab 21 is connected to a die (not shown) and each slot 2a, 2b, 2c, and 2d exposes the die in relation to the metal tab 21. In various embodiments, the metal tab 21 includes a hole 3 for facilitating connection to an overall semiconductor device as discussed in more detail with respect to FIGS. 4A-4C and FIG. 5. In addition the hole may serve to divide the largest longitudinal (diagonal) dimension into shorter sections. Any suitable slab of metal, e.g. such as a Cu slab, can be employed with any suitable etching, cutting, drilling, punch-through process, and/or any other suitable mechanical process useful for making holes in metal, and/or any combinations thereof can be used to create the holes.

The mismatch in length Δl between two materials 1 and 2, connected face to face to each other, connected with the same dimension l initially, is defined by the following:

$$\Delta l = l \times \Delta T \times \Delta CTE \qquad \text{Equation 1}$$

l . . . initial length; ΔT . . . temperature alteration; ΔCTE . . . mismatch of CTE between material 1 and material 2

Accordingly, as shown in FIG. 1A, dividing a tab or slab dimension into two shorter pieces, by creating a gap e.g. with respect to slot 2d, and with respect to the overall length of the side of the metal tab associated with that slot 2d, reduces the mismatch Δl (differential expansion) by reduction of length l from one end of a tab portion to the other end of the tab portion, e.g. half. As such, in any application, where reducing the differential expansion of a metal tab with respect to a semiconductor substrate, including pure metal or sandwich of metals or alloy tab, e.g. a metal alloy tab that include Cu, or a pure metal tab, such as a pure Cu metal tab, utilizing the one or more slots 2a, 2b, 2c, and 2d can be useful. For example, in the instance where a pure metal tab of Cu is used, e.g. connected and in contact with a silicon die (not shown), the expansion of Cu exceeds that of Si, and introducing the slot 2d (and 2a, 2b, 2c, etc.) ensures that, during change of ambient temperatures, the tab can expand at a rate commensurate with the rate of the Si die (not shown with respect to FIG. 1A and FIG. 1B), which reduces defects associated with overall device performance by reduction of thermomechanical stress between the silicon die and the metal tab. Although as shown the metal tab 21 is divided into four pieces 1a, 1b, 1c, and 1d, a single slot can be utilized, additional divisions can be made, and/or any other configuration consistent with the teachings herein can be employed.

Figure 1B:
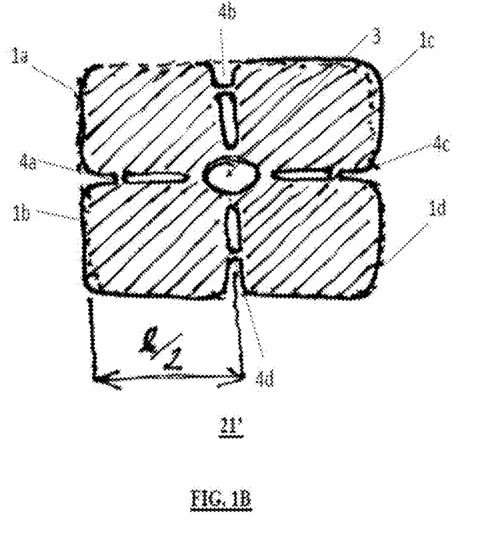
FIG. 1B shows a metal tab for use in semiconductor packaging in accordance with at least one embodiment of the present disclosure.

Turning to FIG. 1B there is shown a metal tab 21' according to various embodiments of the present disclosure. The metal tab 21' includes the slots, portions, and other features of the metal tab 21 of FIG. 1A, except that, additionally, the metal tab 21' includes at least one support 4a, 4b, 4c, and 4d in between the slots. The supports 4a, 4b, 4c, and 4d provide additional mechanical support when connecting the metal tab 21' to other device elements, during various aspects of the manufacturing and assembly process, and additional support during the introduction of various stressors during final device operation, including thermomechanical stress. The supports 4a, 4b, 4c, and 4d can be of the same type of material, e.g. pure Cu, as the material composing the metal tab 21', and the etching, cutting, drilling, punch-through process, any other suitable mechanical process useful for making holes in metal, and/or any combinations thereof for making the slots can be adjusted to ensure a lingering connection, e.g. support 4a, 4b, 4c, and 4d exists between the respective pieces 1a, 1b, 1c and 1d. As with metal tab 21, although metal tab 21' is shown as being divided into four pieces, a single slot can be utilized, additional divisions can be made, and/or any other configuration consistent with the teachings herein can be employed.

Figure 1C:
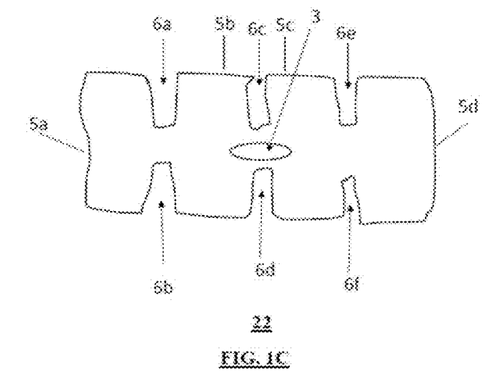
FIG. 1C shows a metal tab for use in semiconductor packaging in accordance with at least one embodiment of the present disclosure.

FIG. 1C depicts a further tab structure 22 arranged according to additional embodiments of the disclosure. In these embodiments, the tab structure 22 may have an overall rectangular shape, suitable for contacting a rectangular shaped die (not shown), where one lateral dimension of the die is greater than the other. In this case, slots may be formed just along one set of opposing edges, or more slots may be formed along one set of opposing edges than along the other set of opposing edges. As shown, the tab structure 22 is portioned into one or more sections 5a, 5b, 5c, and 5d. Section 5a is associated with slots 6a and 6b that separate section 5a and 5b. Section 5b is associated with slots 6a and 6b that separate section 5b and section 5a, and section 5b is also associated with slots 6c and 6d which separate section 5b and section 5c. Section 5c is associated with slots 6c and 6d that separate section 5c and 5b, and section 5c is also associated with slots 6e and 6f which separate section 5c and 5d. Section 5d is associated with slots 6e and 6f that separate section 5c and section 5d. In various embodiments, as shown with respect to tab structure 22 the slabs 5a, 5b, 5c, and 5d are in the vertical direction. In various embodiments, a hole 3 can be located anywhere in the lateral section of the tab structure 22, including but not limited to the center of tab structure 22. As with metal tab 21 and metal tab 21', although tab structure 22 is shown as being divided into multiple pieces, a single slot can be utilized, additional divisions can be made, and/or any other configuration consistent with the teachings herein can be employed. In various embodiments, although not expressly shown, support structure(s) as described with respect structure to metal tab 21' can be utilized with respect to tab structure 22.

Figure 1D:
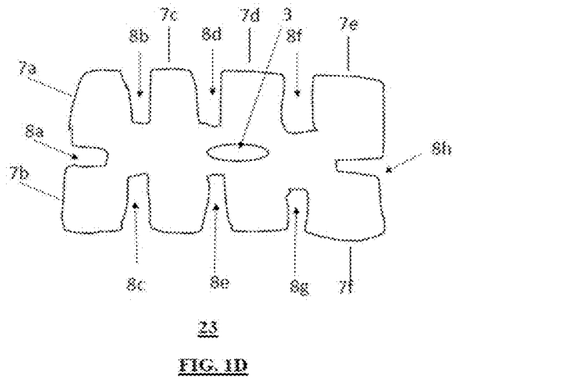
FIG. 1D shows a metal tab for use in semiconductor packaging in accordance with at least one embodiment of the present disclosure.

FIG. 1D depicts a further tab structure 23 arranged according to additional embodiments of the disclosure. In these embodiments, the tab structure 23 may have an overall rectangular shape, suitable for contacting a rectangular shaped die (not shown), where one lateral dimension of the die is greater than the other. In this case, slots may be formed along the perimeter of the structure, including both the horizontal and vertical direction. As shown, the tab structure 23 is portioned into one or more sections 7a, 7b, 7c, 7d 7e and 7f. Section 7a is associated with slot 8a in the horizontal direction, which separates section 7a and section 7b. Section 7a is also associated with slots 8b in the vertical direction that separate section 7a and section 7c. Section 7b is similarly associated with slots 8b and 8c which separate section 7b from section 7c in the vertical direction. Section 7c is associated with slots 8b and 8c which separate section 7c from both section 7a and section 7b in the vertical direction, and section 7c is also associated with slots 8d and 8e in the vertical direction which separate section 7c from section 7d. Section 7d is associated with slots 8d and 8e which separate section 7d from section 7c in the vertical direction, and section 7d is also associated with slots 8f and 8g in the vertical direction which separate section 7d from section 7e and section 7f in the vertical direction. Section 7e and section 7f are associated with section slot 8h that separates section 7e and 7f in the horizontal direction, and section 7e and section 7f are is associated with slots 8f and 8g, which separate section 7e and section 7f from section 7d in the vertical direction. In various embodiments, as shown with respect to tab structure 22 the slots 6a, 6b, 6c, 6d, 6e and 6f are in the vertical direction. In various embodiments, a hole 3 can be located anywhere in the lateral section of the tab structure 22, including but not limited to the center of tab structure 22. As with metal tab 21, metal tab 21', metal tab 23, although tab 22 structure is shown as being divided into multiple pieces, a single slot can be utilized, additional divisions can be made, and/or any other configuration consistent with the teachings herein can be employed. In various embodiments, although not expressly shown, support structure(s) as described with respect structure to metal tab 21' can be utilized with respect to structure 23.

Notably, in the aforementioned embodiments, where a side of the metal tab is defined by a length l, a slot or a plurality of slots will extend along a given direction of the side of the metal tab where the length of the slot or sum of length of the plurality of slots is less than the value of l. Said differently, because the metal slots do not completely separate the multiple pieces from one another, the length of the slots must be less than l, the length of the side. Thus, wherever a slot is present, the effective length of the metal tab is reduced to the lengths of the different portions or pieces of the metal tab, described above. However, where the slot is not present, metal material will extend along an entire side of the metal tab, to the length l, as shown in region 11 of FIG. 1A. According to various embodiments of the disclosure, the total length of the slot(s) extending along a given side may equal at least 0.5 l, where the total length of additional apertures, such as a hole 3, may be less than 0.2 l. In this manner the slots may effectively divide the metal tab in question into smaller lengths over sufficient portions of the metal tab to reduce the thermal mismatch between metal tab and substrate during heating and/or cooling.

Figure 2A:
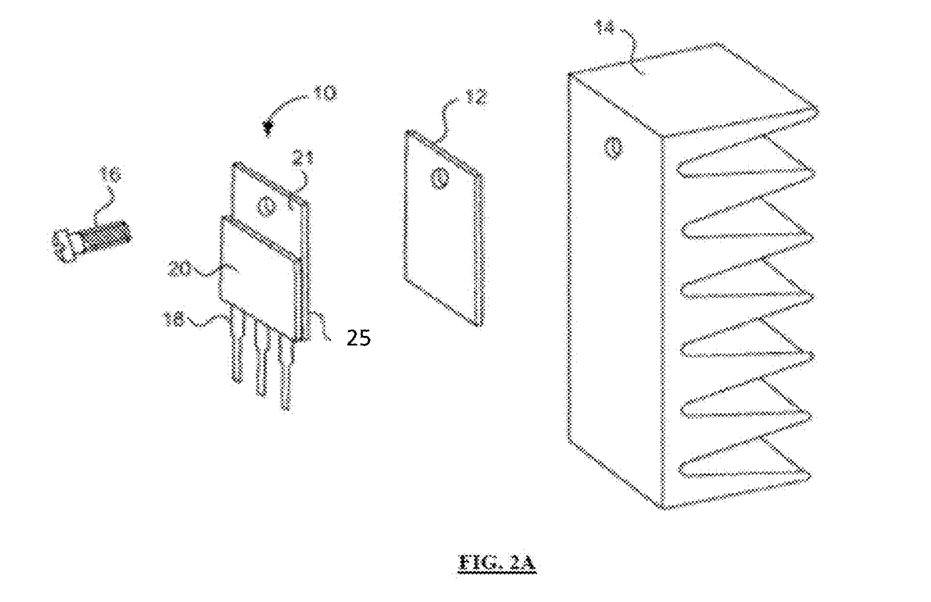
FIG. 2A shows a simplified exploded view of a packaged power semiconductor device mounted to a heatsink with an intervening insulating pad and utilizing at least one of the metal tabs of FIG. 1A and/or FIG. 1B and in accordance with at least one embodiment of the present disclosure.

FIG. 2A illustrates a known semiconductor device providing insufficient electrical isolation in accordance with various embodiments of the present disclosure, and utilizing the metal tab of either FIG. 1A and/or FIG. 1B (with metal tab 21 of FIG. 1A being expressly shown). In various embodiments, a packaged power semiconductor device 10, an insulating pad 12, a heatsink 14, and a screw 16 are provided. The screw is used to attach the power semiconductor device 10 and the insulating pad 12 to the heatsink 14. The semiconductor die is attached to a metal tab 21, leads 18 are electrically coupled to the terminal of the die, and the assembly is then encapsulated with encapsulating material 20. The encapsulating material is typically epoxy, plastic, rubber, silicone, or similar materials and is molded, cast, or otherwise formed over the die and related structures.

The heatsink 14 is usually made of a thermally conductive material such as metal, and the insulating pad 12 is typically made of an insulting material such as silicone rubber, mica, or ceramic, and may be in the form of a washer or other shape, rather than a pad. It is desirable that the insulating pad 12 provide electrical isolation between the backside 25 of the power semiconductor device 10 and the heatsink 14 while also providing good thermal coupling to the heat sink. Further improvement of thermal coupling between the semiconductor device 10, the insulating pad 12, and the heatsink 14 can be realized by applying thermal grease or phase change material between the power semiconductor device 10 and the insulating pad 12 and/or between the insulating pad 12 and the heatsink 14.

Figure 2B:
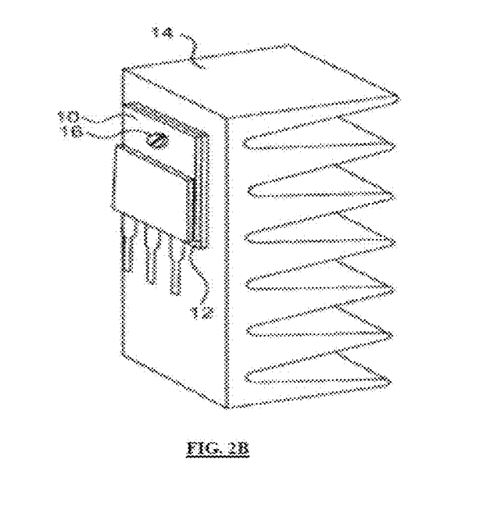
FIG. 2B shows a simplified view of the assembled components shown in FIG. 2A and in accordance with at least one embodiment of the present disclosure.

FIG. 2B is a simplified view of the power semiconductor device 10 and the insulating pad 12 mounted to the heatsink 14 with the screw 16. The screw 16 can be made of an insulating material, such as nylon, or additional insulating washers and/or sleeves can be used to isolate the power semiconductor device from the heatsink. In some applications, it may be necessary to provide enhanced heatsinking. Soldering the power semiconductor device 10 to the heatsink 14 will provide superior thermal coupling. However, the heatsink 14 would typically need to be isolated from the rest of the circuit or chassis, and may require a shield to prevent a technician from inadvertently touching an electrically "hot" heatsink, which could be at a lethal voltage.

With respect to both FIG. 2A and FIG. 2B, the benefits of the metal tab 21 (and/or metal tab 21') are employed in reference to the discussion associated with FIG. 1A and FIG. 2B. Notably, in the embodiments of FIGS. 2A and 2B, the power semiconductor device 10 may be sintered or soldered to a substrate or baseframe or leadframe (not separately shown). The embodiment of FIGS. 2A, 2B represents a embodiment of non-insulated configuration, where an insulating pad is needed, while in insulating configurations, the insulator pad may be omitted.

Figure 3:
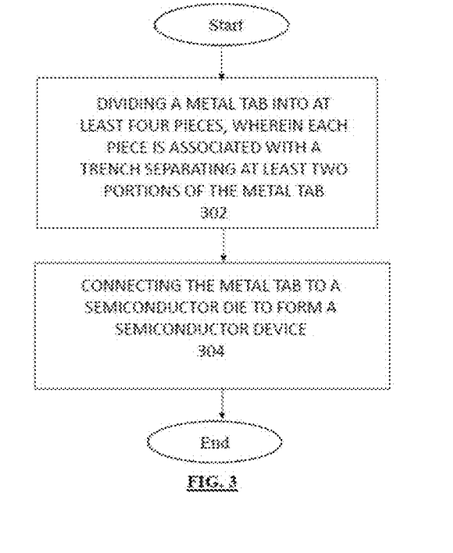
FIG. 3 depicts a process flow, according to at least one embodiment of the present disclosure.

FIG. 3 depicts a process flow 300, according to embodiments of the disclosure. At block 302, a metal tab is divided into four pieces, each with an associated slot therebetween creating at least two portions therebetween. The metal tab can be divided into four pieces using a suitable mechanical process as discussed herein or any other suitable process. According to various embodiments of the disclosure the different pieces of the metal tab may be integrally connected to other pieces of the metal tab. Said differently, the four different pieces may constitute four different portions of the metal tab where the four different pieces form part of an integral whole, where a given slot serves to delineate the border between one piece and an adjacent piece.

In various embodiments, the mechanical process employed to establish the dividing of the metal tab can be such so as to allow supports in between each of the four portions (and associated four slots) so as to provide additional support during manufacture, assembly, transport, and/or use. At block 304, the metal tab can be connected to a semiconductor die utilizing any suitable via, soldering, sintering or other connection to connect the tab to the die and to other components of an overall semiconductor packaging scheme as may be required.

In various embodiments the metal tab may be formed of copper, or a copper alloy, while the semiconductor die is a silicon die. Advantageously, the slots provided between different pieces may serve to reduce the thermal mismatch stress during heating or cooling of the semiconductor die, that would otherwise be present due to large difference in coefficients of thermal expansion between copper and silicon.

In some embodiments, a support may be provided between each of the at least four pieces, where the support spans a slot or slot region. The support may be an integral part of the metal that forms the tab, and may be formed in a manner to divide a slot into a plurality of shorter slots.

Figure 4A:
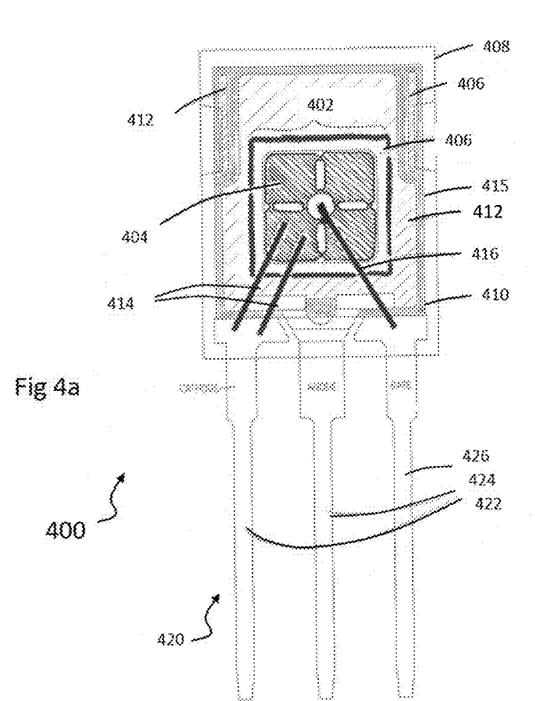
FIG. 4a depicts a semiconductor die assembly, according to at least one embodiment of the present disclosure.
Figure 4B:
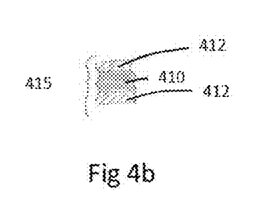
FIG. 4b depicts a side view of a substrate of the semiconductor die assembly of FIG. 4a, according to at least one embodiment of the present disclosure.
Figure 4C:
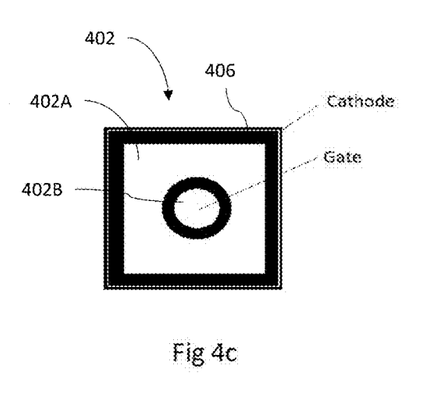
FIG. 4c depicts a top view of a semiconductor die of the semiconductor die assembly of FIG. 4a, before assembly, according to at least one embodiment of the present disclosure.

FIG. 4a depicts a semiconductor device assembly 400, according to at least one embodiment of the present disclosure. The semiconductor die assembly may include a semiconductor die 402, having a metal tab 404, attached to a main surface, such as an upper main surface, where the metal tab 404 may be arranged according to the embodiments of FIGS. 1A-1D, in various non-limiting embodiments. In the embodiment of FIG. 4a, the metal tab 404 may be bounded by a passivation rim 406 around the outer portion of the top of the semiconductor die 402. In turn, the semiconductor die 402 may be affixed to a substrate 415. FIG. 4b shows a cross-sectional view of the substrate 415, including a ceramic plate 410, sandwiched between two metal layers, shown as metal layers 412, which layers may be copper. In some embodiments, the substrate 408 may be a direct copper bonded substrate (DCB) as known in the art, where a copper layer is fused to a ceramic substrate at high temperature. Thus, a lower main surface of the semiconductor die (not shown) may be electrically connected to the upper metal layer of metal layers 412. As such, external contacts to a leadframe, such as a copper leadframe, may be made in the following manner. In the example of FIG. 4a, the metal tab 404 has been affixed to the semiconductor die 402. According to different embodiments, this attachment of semiconductor die 402 to metal tab 404 may be accomplished by soldering, sintering or other process as known in the art. For clarity, FIG. 4c shows the semiconductor die 402 before attachment to the metal tab 404, including a cathode electrode 402a and a gate electrode 402b, separated by an insulating region. After assembly, the metal tab 404 contacts the cathode electrode 402A, with the central hole in the metal tab aligned over the region of the gate electrode 402b.

A cathode lead 422 is coupled to the metal tab 404 by wires 414, extending above the surface of the semiconductor die 402 and the substrate 408. An anode lead 424 is directly connected to the metal layer 412 that is in electrical contact with the lower main surface (not shown) of the semiconductor die 402, while a gate lead 426 is connected to a gate terminal in the center of the semiconductor die 402 by wire 416, extending above the surface of the semiconductor die 402 and the substrate 408.

Figure 5:
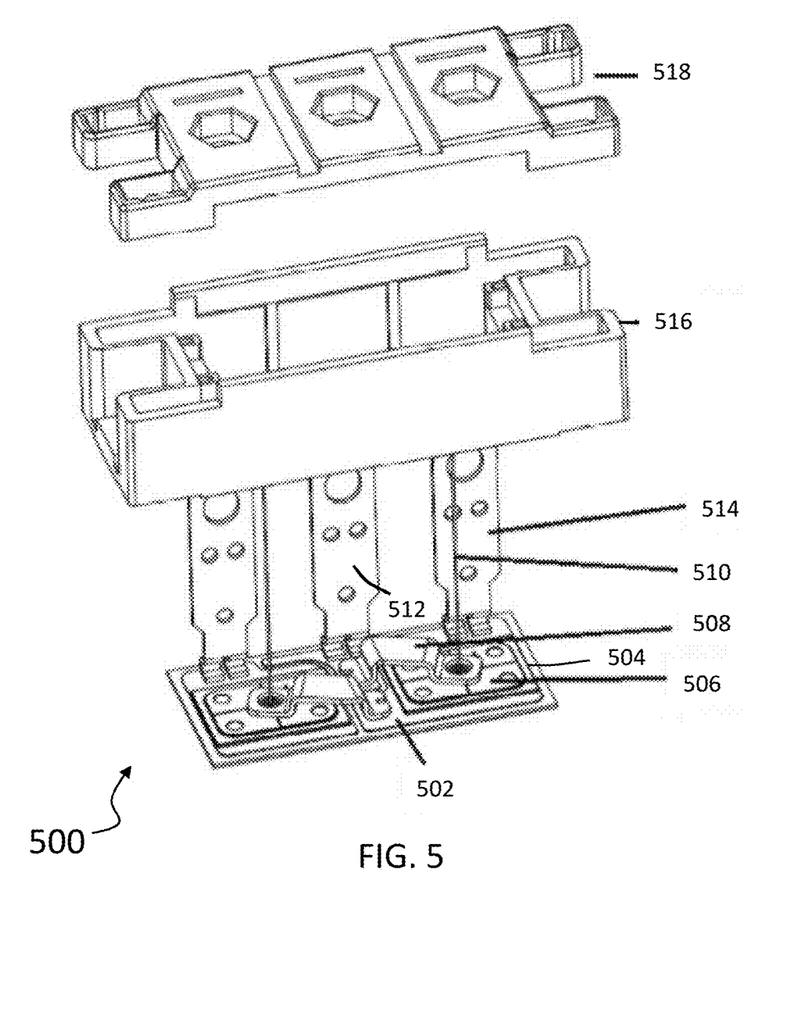
FIG. 5 depicts a semiconductor die package, according to at least one embodiment of the present disclosure.

FIG. 5 depicts a semiconductor die module 500, according to at least one embodiment of the present disclosure. A substrate 502 is provided, where two different semiconductor die are affixed to the substrate. The substrate 502 may be arranged generally as described with respect to the substrate of FIG. 4. A metal tab 506 is affixed to each of the semiconductor die 504, where the metal tab 506 may be arranged according to the embodiments of FIGS. 1A-1D, in various non-limiting embodiments. A conductive clip 508 may connect each metal tab 506 to an external terminal 512, which terminal may electrically connect to the anodes of the semiconductor device of semiconductor die 504. Terminals 514 may electrically connect to the anodes of the semiconductor device of semiconductor die 504, by coupling to a copper layer (as shown in metal layer 412 of FIG. 4). As shown in FIG. 5 the semiconductor die module 500 further includes a housing that is divided into a housing body 516, adapted to fit over the substrate 502, and a lid 518. When assembled the terminals 514 and external terminal 512 may extend through openings provided in the housing body 516 and the lid 518 to couple to external connections.

In summary, the present embodiments, by providing novel metal tab configurations, facilitate use of metal materials for tabs, even when the thermal mismatch between metal and semiconductor substrate is relatively large, including copper-based materials. In addition, the present embodiments facilitate the use of thinner tabs due to the ability to use a single material for a tab, such as copper. For example, known tab structures may feature a sandwich layer structure of iron alloy between two layers of copper, where the middle iron alloy layer is used because of a relatively low coefficient of thermal expansion, more closely matched to silicon, while the outer copper layers are used for contacting. Such a configuration may result in a tab thickness of 1 mm or more. In various embodiments of the present disclosure, a tab structure as detailed hereinabove, may be composed of a single layer of copper or copper alloy, and may have a thickness in the range of 50 μm to 500 μm.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A semiconductor device comprising:
   a metal tab comprising a central hole; and
   a semiconductor die comprising a cathode electrode and a gate electrode, the semiconductor die connected to the metal tab such that the metal tab contacts the cathode electrode, with the central hole in the metal tab aligned over the gate electrode, wherein the metal tab includes at least one slot on at least one side of the metal tab, wherein the at least one slot i) creates an opening between at least two portions of the metal tab and ii) exposes the semiconductor die in relation to the metal tab.

2. The semiconductor device of claim 1, wherein the semiconductor die is a silicon (Si) die, and wherein the metal tab includes copper (Cu).

3. The semiconductor device of claim 2, wherein the metal tab is a Cu tab.

4. The semiconductor device of claim 3, wherein the Cu tab includes at least four sides, wherein the at least one slot includes at least four slots corresponding to each of the at least four sides, and wherein with respect to each of the at least four sides, each corresponding slot i) creates an opening between at least two portions of the metal tab and ii) exposes the semiconductor die in relation to the Cu metal tab.

5. The semiconductor device of claim 4, wherein each of the four slots includes a support corresponding to the respective opening between the at least two portions of the metal tab associated with each slot.

6. The semiconductor device of claim 3, wherein the at least one slot includes a support between each end of the at least two portions of the metal tab.

7. The semiconductor device of claim 6, wherein the Cu tab includes at least four sides, wherein the at least one slot includes at least four slots corresponding to each of the at least four sides, and wherein with respect to each of the at least four sides, each corresponding slot i) creates an opening between at least two portions of the metal tab and ii) exposes the semiconductor die in relation to the Cu metal tab.

8. A semiconductor device assembly, comprising
a semiconductor die comprising a cathode electrode and a gate electrode;
a metal tab comprising a central hole, wherein the metal tab is attached to a main surface of the semiconductor die and the central hole in the metal tab is aligned over the gate electrode, wherein the semiconductor die is connected to the metal tab such that the metal tab contacts the cathode electrode;
wherein the metal tab includes at least one slot on at least one side of the metal tab, wherein the at least one slot i) creates an opening between at least two portions of the metal tab and ii) exposes the semiconductor die in relation to the metal tab; and
a substrate, the semiconductor die being affixed to and electrically connected to the substrate.

9. The semiconductor device assembly of claim 8, the substrate comprising:
a ceramic plate;
a first metal layer, affixed to a first main surface of the ceramic plate; and
a second metal layer, affixed to a second main surface of the ceramic plate, opposite to the first main surface, wherein the semiconductor die is disposed in contact with the first metal layer.

10. The semiconductor device assembly of claim 9, the substrate comprising a direct copper bond substrate, wherein the first metal layer and the second metal layer comprise copper.

11. The semiconductor device assembly of claim 9, further comprising a leadframe, electrically connected to the semiconductor die, wherein a first lead of the leadframe is electrically coupled to the first metal layer, and a second lead of the leadframe is electrically coupled to the metal tab.

12. The semiconductor device assembly of claim 8, wherein the semiconductor die is a silicon (Si) die, and wherein the metal tab includes copper (Cu).

13. The semiconductor device assembly of claim 12, wherein the metal tab includes at least four sides, wherein the at least one slot includes at least four slots corresponding to each of that at least four sides, and wherein with respect to each of the at least four sides, each corresponding slot i) creates an opening between at least two portions of the metal tab and ii) exposes the Si die in relation to the metal tab.

14. The semiconductor device assembly of claim 12, wherein the metal tab includes at least four sides, wherein the at least one slot includes at least four slots corresponding to each of that at least four sides, and wherein with respect to each of the at least four sides, each corresponding slot i) creates an opening between at least two portions of the metal tab and ii) exposes the Si die in relation to the metal tab.

15. The semiconductor device assembly of claim 8, wherein the at least one slot includes a support between each end of the at least two portions of the metal tab.

16. A semiconductor device module, comprising
a substrate, comprising a ceramic material;
a plurality of semiconductor die, affixed to the substrate on an upper main surface of the substrate, each of the semiconductor die further comprising a passivation rim around an outer portion of a top of the semiconductor die;
a plurality of metal tabs, wherein a given metal tab of the plurality of metal tabs comprises a central hole, is bounded by the passivation rim, and is attached to a first main surface of a given semiconductor die of the plurality of semiconductor die;
wherein the given metal tab includes at least one slot on at least one side of the metal tab, wherein the at least one slot i) creates an opening between at least two portions of the metal tab and ii) exposes the semiconductor die in relation to the metal tab;
a plurality of electrical terminals, electrically connected to the plurality of semiconductor die, wherein one terminal of the plurality of metal terminals is electrically coupled to the plurality of metal tabs; and
a housing, wherein the housing is adapted to fit over the plurality of semiconductor die, and wherein the housing includes a plurality of openings to accommodate the plurality of electrical terminals.

17. The semiconductor device module of claim 16, the substrate comprising:
a ceramic plate;
a first metal layer, affixed to a first main surface of the ceramic plate; and
a second metal layer, affixed to a second main surface of the ceramic plate, opposite to the first main surface, wherein the semiconductor die is disposed in contact with the first metal layer.

18. The semiconductor device module of claim 17, the substrate comprising a direct copper bond substrate, wherein the first metal layer and the second metal layer comprise copper.

19. The semiconductor device module of claim 16, further comprising a leadframe, electrically connected to the semiconductor die, wherein a first lead of the leadframe is electrically coupled to the first metal layer, and a second lead of the leadframe is electrically coupled to the metal tab.

20. The semiconductor device module of claim 16, wherein the plurality of semiconductor die are a silicon (Si) die, and wherein the metal tab includes copper (Cu).

* * * * *